United States Patent
Tanaka

(10) Patent No.: US 10,686,111 B2
(45) Date of Patent: Jun. 16, 2020

(54) THERMOELECTRIC CONVERSION ELEMENT AND METHOD OF MANUFACTURING THE SAME

(71) Applicant: Panasonic Intellectual Property Management Co., Ltd., Osaka (JP)

(72) Inventor: Junya Tanaka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/715,595

(22) Filed: Sep. 26, 2017

(65) Prior Publication Data

US 2018/0145238 A1 May 24, 2018

(30) Foreign Application Priority Data

Nov. 22, 2016 (JP) .................. 2016-227030

(51) Int. Cl.
*H01L 35/18* (2006.01)
*H01L 35/16* (2006.01)
(Continued)

(52) U.S. Cl.
CPC .............. *H01L 35/18* (2013.01); *H01L 35/34* (2013.01); *C22C 12/00* (2013.01); *C22C 19/03* (2013.01);
(Continued)

(58) Field of Classification Search
CPC ......... H01L 35/12; H01L 35/14; H01L 35/16; H01L 35/18; H01L 35/26; H01L 35/20;
(Continued)

(56) References Cited

U.S. PATENT DOCUMENTS 3,444,006 A * 5/1969 Scuro ...................... H01L 35/08
136/205
3,737,345 A * 6/1973 Kudman ................. H01L 35/16
136/236.1
(Continued)

FOREIGN PATENT DOCUMENTS

JP 2002033526 A * 1/2002
JP 2016006827 A * 1/2016
WO 2015/030218 3/2015

OTHER PUBLICATIONS

WebElements: the periodic table on the web: Indium crystal structure "https://www.webelements.com/indium/crystal_structure.html" (Year: 2008).*
(Continued)

*Primary Examiner* — Andrew J Golden
(74) *Attorney, Agent, or Firm* — McDermott Will & Emery LLP

(57) ABSTRACT

A thermoelectric conversion element including a thermoelectric conversion member formed of a skutterudite-type material containing an element L (indicating one or more elements selected from a group including In, Yb, Eu, Ce, La, Nd, Ga and Sr), an element M (indicating one or more elements selected from a group including Co, Rh, Ir, Fe, Ni, Pt, Pd, Ru and Os), and an element Pn (indicating one or more elements selected from a group including Sb, As, P, Te, Sn, Bi, Ge, Se and Si), an insulator covering the thermoelectric conversion member and a metal layer positioned between the thermoelectric conversion member and the insulator as well as containing the element L.

8 Claims, 6 Drawing Sheets

(51) Int. Cl.
*C22C 19/03* (2006.01)
*C22C 19/07* (2006.01)
*H01L 35/32* (2006.01)
*C22C 12/00* (2006.01)
*H01L 35/34* (2006.01)

(52) U.S. Cl.
CPC .............. *C22C 19/07* (2013.01); *H01L 35/16* (2013.01); *H01L 35/32* (2013.01)

(58) Field of Classification Search
CPC ......... H01L 35/32; H01L 35/34; C22C 12/00; C22C 19/03; C22C 19/07
USPC .................................................. 136/200–242
See application file for complete search history.

(56) References Cited

U.S. PATENT DOCUMENTS

| | | | | |
|---|---|---|---|---|
| 2010/0294326 A1* | 11/2010 | Guo | ........................ | B22F 3/14 |
| | | | | 136/238 |
| 2012/0024332 A1* | 2/2012 | Stefan | ..................... | H01L 35/32 |
| | | | | 136/200 |
| 2013/0199593 A1* | 8/2013 | Higashida | ............... | H01L 35/08 |
| | | | | 136/230 |
| 2015/0107641 A1* | 4/2015 | Sawa | ..................... | H01L 35/18 |
| | | | | 136/239 |
| 2015/0162517 A1* | 6/2015 | Kasichainula | .......... | H01L 35/32 |
| | | | | 136/211 |
| 2016/0172569 A1 | 6/2016 | Fujimoto et al. | | |

OTHER PUBLICATIONS

Rios et al, Modeling Polycrystals with Regular Polyhedra, 2006, Materials Research, vol. 9, No. 2, 231-236. (Year: 2006).*
JP 2002-033526A English machine translation (Year: 2002).*
JP 2016-006827A English machine translation (Year: 2016).*

* cited by examiner

THERMOELECTRIC CONVERSION ELEMENT AND METHOD OF MANUFACTURING THE SAME

TECHNICAL FIELD

The technical field relates to a thermoelectric conversion element and a method of manufacturing the same.

BACKGROUND

A thermoelectric conversion material and a thermoelectric conversion module using the same are used for applications such as, for example, cooling and power generation as devices converting heat into electric power. For example, when direct current is applied to the thermoelectric conversion material, heat transfer occurs from one surface to the other surface, which generates a heat absorbing surface and a heat generating surface. This phenomenon is called the Peltier effect, and when the thermoelectric conversion material is formed as a module and the heat absorbing surface is allowed to contact a target desired to be cooled, the target can be cooled without providing a movable part. On the other hand, when a temperature difference is provided to both ends of the thermoelectric material, an electromotive voltage proportional to the difference is generated. This phenomenon is called the Seebeck effect. For example, when one surface of the module is allowed to contact a target that is wasting excessive thermal energy and the other surface is cooled by air cooling or water cooling, thermal energy can be converted into electrical energy. That is, waste heat energy can be recovered as electrical energy. The thermoelectric conversion module using the Seebeck effect has received attention as a power generation device in recent years, and development is becoming active as a new utilization of the thermoelectric conversion module.

The most well-known material that generates the above thermoelectric conversion phenomenon effectively is a bismuth-tellurium based material. A module using the bismuth-tellurium based material has been already practically used for the application of cooling which utilizes the Peltier effect, and is also used for an application of adjusting temperature of a laser diode for optical communication. Accordingly, use of the bismuth-tellurium based material for the application of power generation is also considered. However, power generation efficiency using the thermoelectric conversion material (bismuth-tellurium based material) has temperature dependence, therefore, the material has not been widely used for the application of power generation.

The above point will be explained in detail. As a physical property value indicating properties of the thermoelectric conversion material, there is a Seebeck coefficient S (unit: V/K). This is a numeric value indicating a size of the electromotive voltage caused by the temperature difference, which is a numeric value indicating a voltage per a unit temperature difference. The Seebeck coefficient takes a positive or negative value according to the thermoelectric conversion material. This is determined according to whether carriers in the thermoelectric conversion material are holes or electrons, and it is common that, when the Seebeck coefficient is a positive value, the material is called P-type, and when the Seebeck coefficient is a negative value, the material is called N-type. As another physical property value indicating properties of the thermoelectric conversion material, there is an electric resistivity ρ (unit: Ω·m). When the electromotive voltage based on Seebeck effect is generated, electricity flows in the thermoelectric conversion material, and electric power which can be taken in the application of power generation is proportional to a product of the voltage and the electric current. Therefore, when the electric resistivity is low, electric power which can be taken is increased. That is, the above two physical property values directly affect power generation ability of the thermoelectric conversion material, which are represented by a numeric value as a power factor PF (unit: W/mk$^2$) (hereinafter also referred to as merely "PF") calculated by the following formula (1).

[Formula 1]

$$PF = \frac{S^2}{\rho} \quad (1)$$

Moreover, a thermal conductivity κ (unit: W/m·K) is also a value indicating properties of the thermoelectric conversion material though the value is not a physical property value directly acting on power generation. This indicates that, in the case where the Seebeck effect is desired to be generated with respect to fixed thermal energy, the temperature difference in the material is hardly generated when the thermal conductivity of the thermoelectric conversion material is too high. Therefore, the temperature difference can be increased in a material having a lower thermal conductivity, as a result, a power generation amount can be increased. As an index obtained by combining a Seebeck coefficient S with an electric resistivity ρ and a thermal conductivity κ, there is a dimensionless performance index ZT which is represented by the following formula (2).

[Formula 2]

$$ZT = \frac{S^2}{\rho \cdot \kappa} \times T \quad (2)$$

The reason why the above dimensionless performance index ZT includes an absolute temperature T(K) is that respective numeric values have temperature dependence. However, as the power generation amount itself is represented by PF as described above, ZT is used as a criterion representing thermoelectric conversion performance. That is, there is a case where ZT indicates a large value when the thermal conductivity is extremely small, ZT may be a large value, however, the power generation amount is not increased unless PF is simultaneously increased. PF of the bismuth-tellurium based material becomes highest in the vicinity of normal temperature and tends to be reduced as the temperature is increased, therefore, the bismuth-tellurium based material is not suitable for being used at high temperature.

When large electric power is desired to be obtained by using the thermoelectric conversion material, it is necessary to take a large temperature difference. Recently, an attempt in which heat in the vicinity of 300° C. discharged from plants or motors of cars and so on is converted into electricity and effectively utilized is being made. However, PF is reduced as the temperature is increased in the bismuth-tellurium based material against an aim of increasing the power generation amount by increasing the temperature difference as described above. That is, it is difficult to increase the power generation amount due to the temperature dependence and consideration of a new material is inevitable.

In order to use a thermoelectric conversion member in an range exceeding 300° C., there is a problem that if is difficult to maintain not only the power generation performance but also quality of the thermoelectric conversion member. That is, the thermoelectric member itself easily reacts to oxygen in air as the temperature increased, and oxidation proceeds. Generation of a portion where oxidation occurs means that a crystal structure forming the thermoelectric conversion member is broken, and a function as the thermoelectric conversion member is deteriorated.

Patent Literature 1 identified below relates to a thermoelectric conversion module. In the literature, to suppress diffusion and oxidation of metal elements on a joint surface of the thermoelectric conversion element (thermoelectric conversion member) by arranging a diffusion prevention layer is described. FIG. 6 shows a schematic cross-sectional view of a thermoelectric conversion element of a thermoelectric conversion module and a joint surface thereof disclosed in Parent Literature 1. As shown in FIG. 6, a P-type thermoelectric conversion element 101 and an N-type thermoelectric conversion element 102 are joined to a high-temperature side electrode 108 covered with an electrode protective layer 107 through a solder layer 106 in the thermoelectric conversion module. Moreover, a first diffusion prevention layer 103 and a second diffusion prevention layer 104 for preventing metal diffusion are arranged between respective thermoelectric conversion elements 101/102 and the solder layer 106, and a solder joint layer 105 for joining to the solder layer 106 is further arranged therebetween. Then, Patent Literature 1 discloses that metal diffusion and oxidation in the joint between the thermoelectric conversion elements 101 and 102 can foe suppressed by adopting the structure.

PATENT LITERATURE

[Patent literature 1] WO2015/030218

SUMMARY

However, the technique of Patent Literature 1 has the following problems. In Patent Literature 1, a focus of suppressing oxidation is only on the joint surface between the thermoelectric conversion element and the electrode, and oxidation of the thermoelectric conversion element itself, namely, oxidation on surfaces other than the joint surface between the thermoelectric conversion element and the electrode is not considered. That is, in the thermoelectric conversion module in Patent Literature 1, even when oxidation of the joint surface between the thermoelectric conversion element and the electrode can be suppressed, oxidation proceeds on surfaces other than the joint surface as materials forming the thermoelectric conversion element contact oxygen, which degrades thermoelectric conversion properties.

The present disclosure has been made in view of the above problems and an object thereof is to provide a highly reliable thermoelectric conversion element in which degradation of thermoelectric conversion properties due to oxidation at high temperature is suppressed.

In order to achieve the above object, the thermoelectric conversion element according to the present disclosure includes the following structure.

A thermoelectric conversion element according to an illustrative embodiment includes a thermoelectric conversion member formed of a skutterudite-type material containing an element L (indicating one or more elements selected from a group including In, Yb, Eu, Ce, La, Nd, Ga and Sr), an element M (indicating one or more elements selected from a group including Co, Rh, Ir, Fe, Ni, Pt, Pd, Ru and Os), and an element Pn (indicating one or more elements selected from a group including Sb, As, P, Te, Sn, Bi, Ge, Se and Si), an insulator covering the thermoelectric conversion member and a metal layer positioned between the thermoelectric conversion member and the insulator, the metal layer containing the element L.

As described above, the present disclosure provides the thermoelectric conversion element capable of holding thermoelectric conversion properties even when being used at high temperature.

DETAILED DESCRIPTION OF PREFERRED EMBODIMENTS

Hereinafter, illustrative embodiments of the present disclosure will be explained with reference to the drawings.

Figure 1:
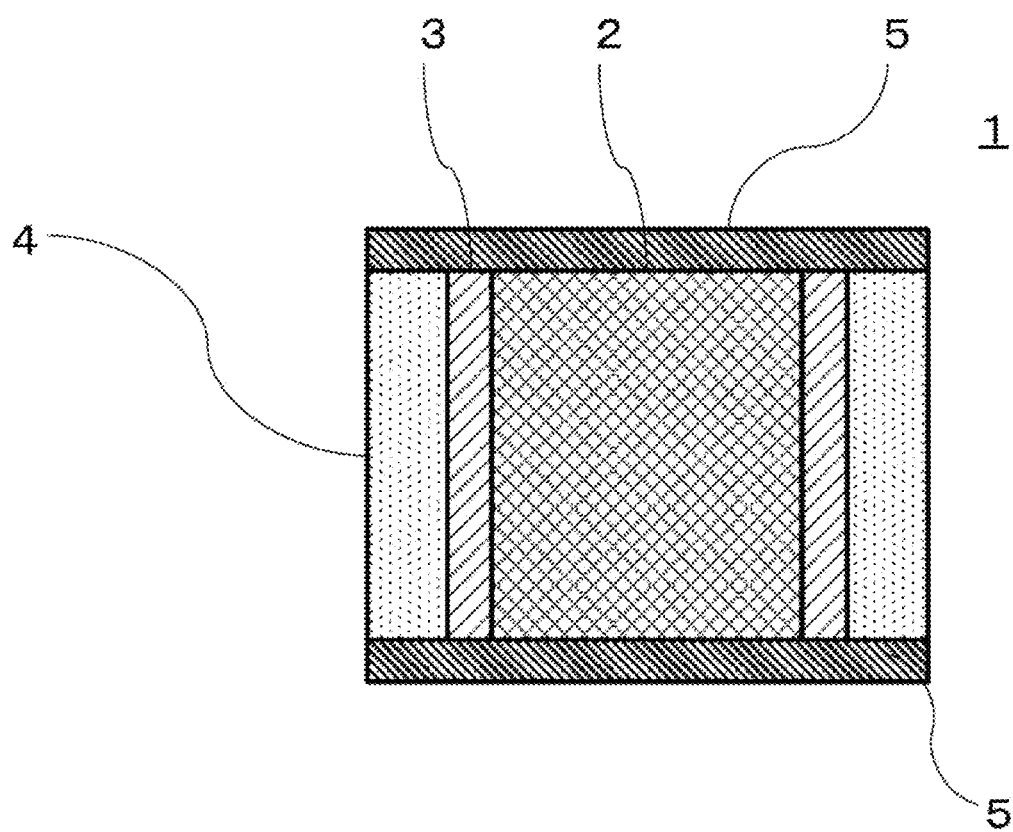
FIG. 1 is a schematic cross-sectional view showing a thermoelectric conversion element according to an embodiment of the present disclosure.

FIG. 1 is a schematic cross-sectional view showing a thermoelectric conversion element 1 according to the illustrative embodiment of the present disclosure. As shown in FIG. 1, the thermoelectric conversion element 1 according to the illustrative embodiment includes a thermoelectric conversion member 2, an insulator 4 covering an outer peripheral surface of the thermoelectric conversion member 2, a metal layer 3 arranged between the thermoelectric conversion member 2 and the insulator 4 and electrodes 5 arranged on an upper bottom surface and a lower bottom surface of the columnar-shaped thermoelectric conversion member 2. Though the structure in which the thermoelectric conversion member 2 has a columnar shape and the insulator 4 covers the outer peripheral surface thereof is adopted in the illustrative embodiment, shapes of the thermoelectric conversion member 2 and the insulator 4 are not particularly limited. For example, the thermoelectric conversion member 2 can be formed in arbitrary shapes such as a prismatic shape. However, whichever shape the thermoelectric conversion member 2 has, it is preferable that surfaces other than regions where the electrodes 5 are arranged are covered with the insulator 4 from a viewpoint of suppressing oxidation and deterioration of the thermoelectric con-version member 2.

The thermoelectric conversion member 2 is formed of a skutterudite-type material containing particular elements. Skutterudite-type materials will be explained below.

As thermoelectric conversion materials suitable for a temperature range exceeding 300° C., there exist materials having a crystal structure called skutterudite-type. The skutterudite-type materials contain group 8 elements M and 5B group elements (pnicogen) Pn in a periodic table, which is a cubic-system solid solution having a composition represented by a general formula $M_4Pn_{12}$. As "M" in the above general formula, elements such as Co, Rn, Ir, Fe, Ni, Pt, Pd, Rn and Os can be cited. As "Pn" in the general formula, elements such as Sb, As, P, Te, Sn, Bi, Ge, Se and Si can be cited.

In a crystal lattice of a skutterudite-type material, vacancies exist at a rate of one vacancy per $M_4Pn_{12}$, and all or part of the vacancies can be filled with rare-earth elements such as La, Ce and Yb, alkaline-earth elements such as Ba and Ca and earth metal elements such as Ti, In and Sn. These are called filled skutterudites, which are included in the skutterudite-type materials. The skutterudite-type materials are represented by a general formula $L_xM_4Pn_{12}$ material ($L_x$ represents the element introduced to the vacancy, which is $0<x\leq1$).

As a skutterudite-type thermoelectric conversion material, for example, a cobalt-antimony based material has been known in the past, and the material is represented by a composition formula $Co_4Sb_{12}$. $Co_4Sb_{12}$ as a simple substance is an N-type thermoelectric conversion material and exhibits a good Seebeck coefficient. However, an electric resistivity is high, which is, for example, approximately $1\times10^{-4}$ at normal temperature, and a thermal conductivity is also high, which is, for example, approximately 10 W/mk at normal temperature. Accordingly, the above-described PF and ZT which are indexes indicating heat generation ability of the thermoelectric conversion material are both low. However, the crystal has relatively large vacancies in the crystal lattice as described above, and other elements are added (to be a filled-skutterudite type) to thereby improve thermoelectric conversion properties. For example, a rare earth element such as Yb (ytterbium) is added to the above $Co_4Sb_{12}$, the electric resistivity and the thermal conductivity can be reduced. In particular, the thermal conductivity is effectively reduced due to the presence of another element. Such effect is called a rattling effect. This is because the added element (for example, Yb) enters a vacancy of the basic structure $Co_4Sb_{12}$ and thermal vibration independent of $Co_4Sb_{12}$ is caused to thereby suppress phonons (lattice vibration) of $Co_4Sb_{12}$ as the basic structure.

The thermoelectric conversion member 2 of the thermoelectric conversion element 1 according to the embodiment is formed of a skutterudite-type material containing an element L (indicating one or more elements selected from a group including In, Yb, Eu, Ce, La, Nd, Ga and Sr), an element M (indicating one or more elements selected from a group including Co, Rh, Ir, Fe, Ni, Pt, Pd, Ru and Os), and an element Pn (indicating one or more elements selected from a group including Sb, As, P, Te, Sn, Br, Ge, Se and Si). Hereinafter, a case where the element L is "In(Indium)", the element M is "Co(cobalt)" and the element Pn is "Sb (antimony)", that is, a case where the thermoelectric member 2 is formed of a filled-skutterudite type material in which "In" is added to the material represented by the composition formula $Co_4Sb_{12}$ will be explained in detail as an example.

As described above, the thermoelectric conversion element 1 according to the present embodiment includes the thermoelectric conversion member 2, the metal layer 3 formed on a side surface of the thermoelectric conversion member 2, the insulator 4 and electrodes 5 formed on both bottom surfaces of the thermoelectric conversion member 2. In more detail, the thermoelectric conversion member 2 has a columnar shape, and the side surface thereof is covered with the insulator 4. Then, top surfaces of the thermoelectric conversion member 2 are not covered with the insulator 4. The electrodes 5 are arranged on these top surfaces.

The thermoelectric conversion member 2 is formed of $Co_4Sb_{12}$ containing In. As described above, the thermoelectric conversion member 2 has the columnar shape in the illustrative embodiment, however, the shape and size of the thermoelectric conversion member 2 may be suitably selected in accordance with the size and shape of the thermoelectric conversion device 1, desired performance and the like.

On the ether hand, the metal layer 3 contains "In". The metal layer 3 may contain not only single phase of "In" but also an oxide thereof. As described later, a thickness of the metal layer 3 may be set to 10 nm or more and 500 nm or less.

The insulator 4 may foe a member formed of materials with high heat resistance such as quartz (glass), silica glass or ceramics like alumina, and particularly quartz (glass) is preferable. A thickness of the insulator 4 is preferably 0.2 mm or more and 5.0 mm or less. When the thickness of the insulator 4 is thin, mechanical strength obtained by arranging the insulator 4 is reduced. On the other hand, when the thickness of the insulator 4 is too thick, a ratio of a volume of the thermoelectric conversion member 2 to a volume of the thermoelectric conversion element 1 is relatively reduced. As a result, the electric resistivity is increased, which leads to a reduction in the power generation amount.

The electrode 5 functions as a metal diffusion prevention layer for suppressing metal diffusion occurring by exposing the thermoelectric conversion element 1 to high temperature and as a joining film for mounting the thermoelectric conversion element 1 on a wiring substrate. As two functions which are suppression of metal diffusion and joining are required for the electrode 5 as described above, the electrode 5 is preferably formed by two, or three or more layers including a film for suppressing metal diffusion and a layer for joining the element to the wiring substrate. As the film for suppressing metal diffusion, for example, metals such as Ti, Mo, Co and Ta or oxides or nitrides thereof can be used. As the film for joining the element to the wiring film, metals such as Ag, Au and Cu can be used. Thicknesses of respective layers can be suitably selected according to the shape or required performance of the thermoelectric conversion element 1.

Here, the shape of the thermoelectric conversion element 1 according to the disclosure is not limited, and arbitrary shapes such as a columnar shape and a prismatic shape may be adopted. However, it is particularly preferable to adopt the columnar shape with an outer diameter ϕ of 0.3 mm or more and 10.0 mm or less. This is because stress concentration occurring when the thermoelectric conversion element 1 is exposed to high temperature can be relaxed in the case of adopting the columnar shape though the function of the thermoelectric conversion element is fulfilled also in the case of adopting other shapes such as the prismatic shape. When the outer diameter ϕ is smaller than 0.3 mm, absolute mechanical strength of the thermoelectric conversion element 1 is easily reduced, and reliability in strength when being dealt with at the time of manufacturing and when the element is formed in the module is easily reduced. On the other hand, when the outer diameter ϕ is larger than 10.00 mm, the number of elements arranged per a unit area is reduced. When the thermoelectric conversion module is used for the application of power generation, the electric power thereof is determined by generated voltage and electric current. When elements with large outer diameters are used, a module with a low-voltage and high-electric current is formed as the number of elements is small. This is because a voltage as a module is determined by the number of elements and an electric current is determined by the total electric resistivity of elements even when elements have the same performance.

A height of the thermoelectric conversion element 1 can be arbitrarily set according to a desired size of the thermoelectric conversion module, and is preferably 0.3 mm or more and 5.0 mm or less. "The height of the thermoelectric conversion element 1" in the embodiment indicates a length of the thermoelectric conversion element 1 in an axial direction, namely, a length of the thermoelectric conversion element 1 in a direction perpendicular to the electrodes 5. The thinner the thermoelectric conversion element 1 is, namely, the lower the height of the thermoelectric conversion element 1 is, the lower the electric resistivity becomes, and the power generation amount is increased. However, when the height of the thermoelectric conversion element 1 is low, it is difficult to make a temperature difference between end surfaces (between both electrodes) of the thermoelectric conversion device 1. Therefore, the electric resistivity is reduced and the power generation amount is cancelled by an increase in electric current and a reduction in temperature difference. On the other hand, when the thermoelectric conversion device 1 is too thick, the temperature difference between end surfaces may be easily made, however, the electric resistivity is increased. Therefore, a phenomenon opposite to the case where the thermoelectric conversion element 1 is thin occurs. Accordingly, it is necessary to set the height of the thermoelectric conversion element 1 in accordance with temperature environment in which the thermoelectric conversion module is installed.

Figure 2A:
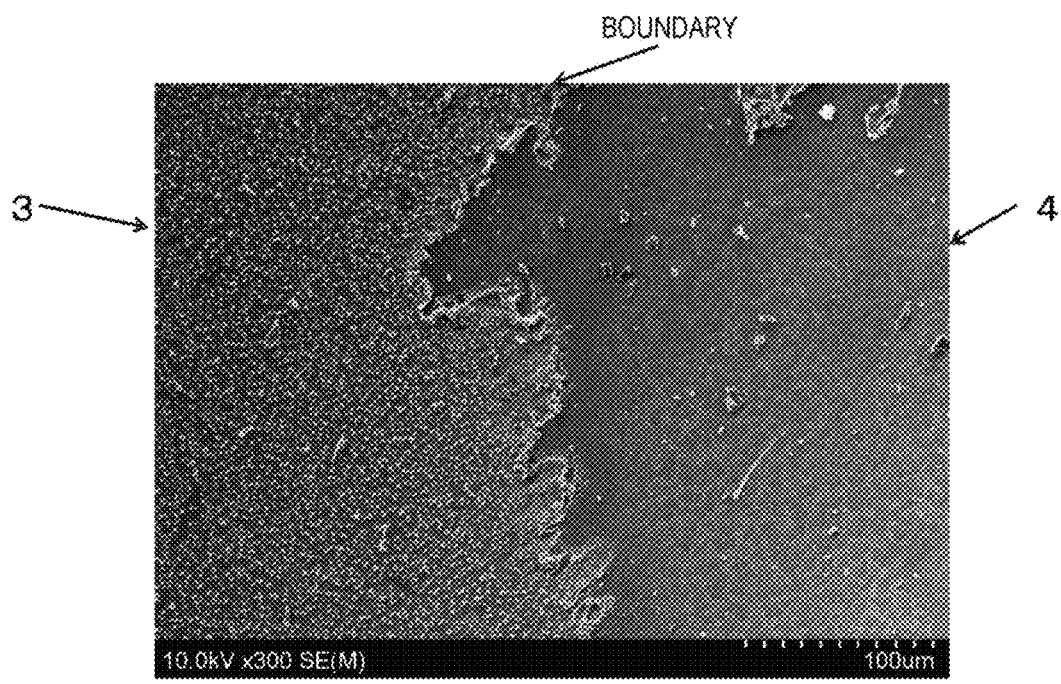
FIG. 2A shows an electronic microscope image showing the presence of a metal layer according to the embodiment of the present disclosure.
Figure 2B:
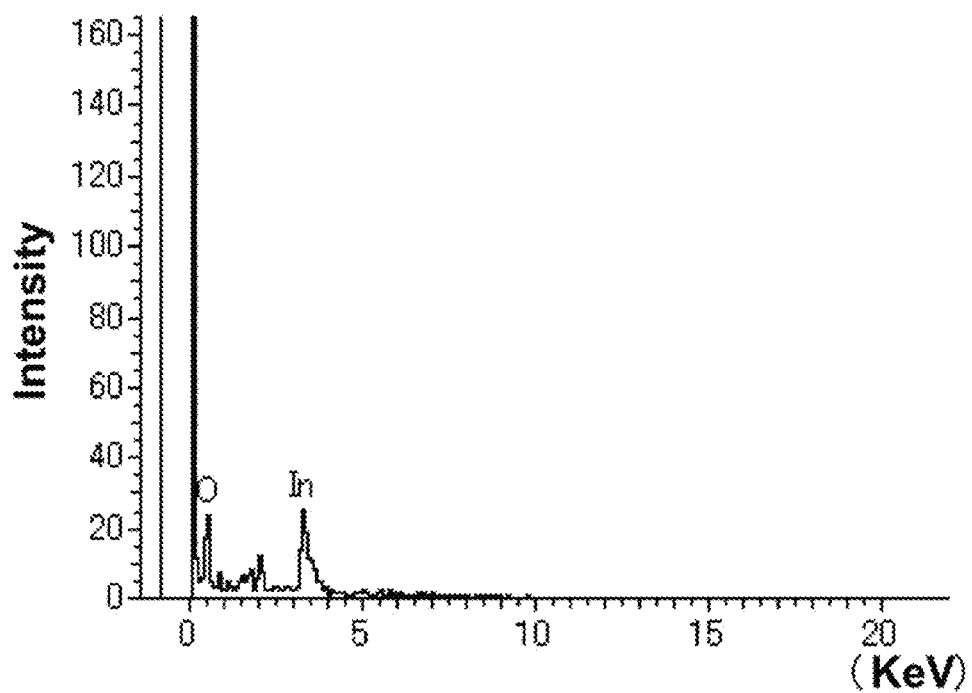
FIG. 2B shows an elemental analysis spectrum of the metal layer.

Here, an electronic microscope image indicating that the metal layer 3 exists in the thermoelectric conversion element 1 according to the embodiment which is actually fabricated is shown in FIG. 2A. FIG. 2A shows a state in which the insulator (hereinafter also referred to as an "insulating tube") 4 is peeled off from the thermoelectric conversion element 1 fabricated by a later-described manufacturing method to observe an inner wall of the insulating tube 4. In FIG. 2A, the metal layer 3 can be recognized on the left side and a region where part of the metal layer 3 is peeled off and a surface of the insulating tube 4 is exposed can be recognized on the right side. It can be seen that there is a boundary between the metal layer 3 and the insulating tube 4 almost at the center of FIG. 2A and that a layer different from the insulating tube 4 (metal layer 3) is formed on the insulating tube 4. Here, as a result of performing elemental analysis of the left-side region (metal layer 3) in FIG. 2A, "In" and "O" were detected. FIG. 2B shows an elemental analysis spectrum. FIG. 2B shows measurement results by an energy dispersive X-ray spectroscopy. In this method, a characteristic X-ray peculiar to an element generated by irradiating a target with an electronic beam is detected and used for spectroscopy to thereby identify the element. A horizontal axis in FIG. 2B represents energy peculiar to the element, and a peak position varies according to the element. On the other hand, a vertical axis represents intensity of detected energy. As can be seen from the measurement results, a composition of the left-side region in FIG. 2A is different from the composition of the thermoelectric conversion member 2 and is further different from the composition of the insulating tube 4. That is, it is found that the metal layer 3 is formed between the thermoelectric conversion member 2 and the insulating tube "In" of the metal layer 3 is deposited from the thermoelectric conversion member 2. "O" is obtained as "In" reacts to oxygen when contacting air and the surface thereof is oxidized. As analysis apparatuses, "SU-70 scanning electron microscope" manufactured by HITACHI HIGH-TECHNOLOGIES CORPORATION, and "inca X-act" manufactured by Oxford Instruments were used.

Figure 3A:
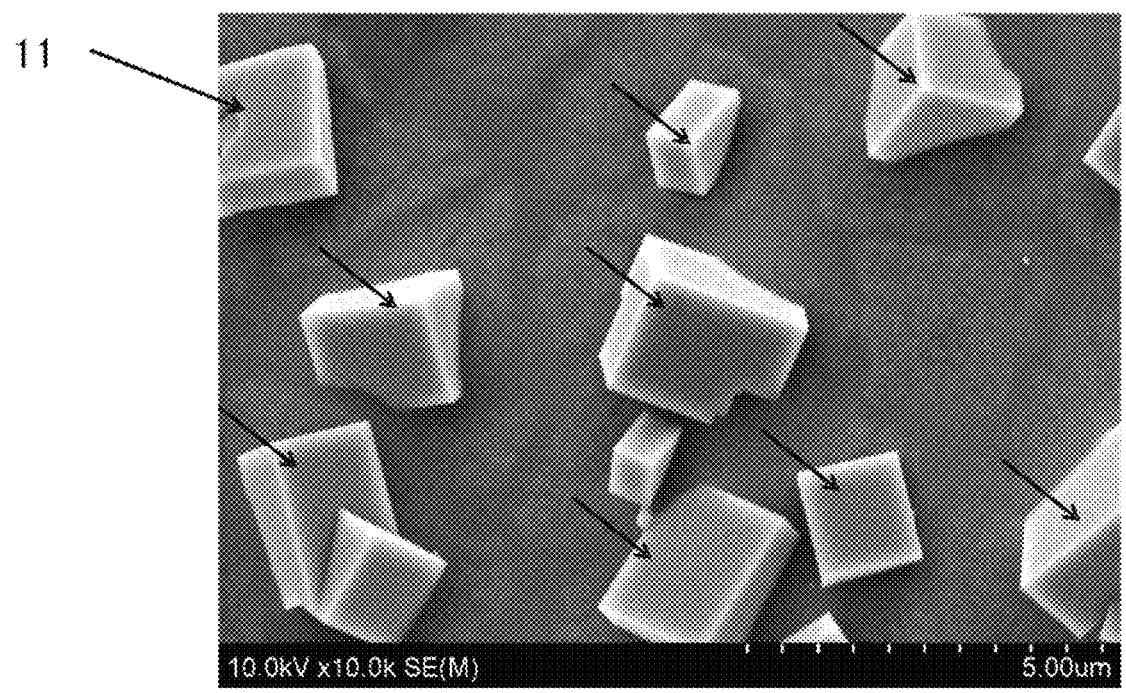
FIG. 3A shows an electronic microscope image showing polyhedral-shaped crystals contained in the metal layer according to the embodiment of the present disclosure.
Figure 3B:
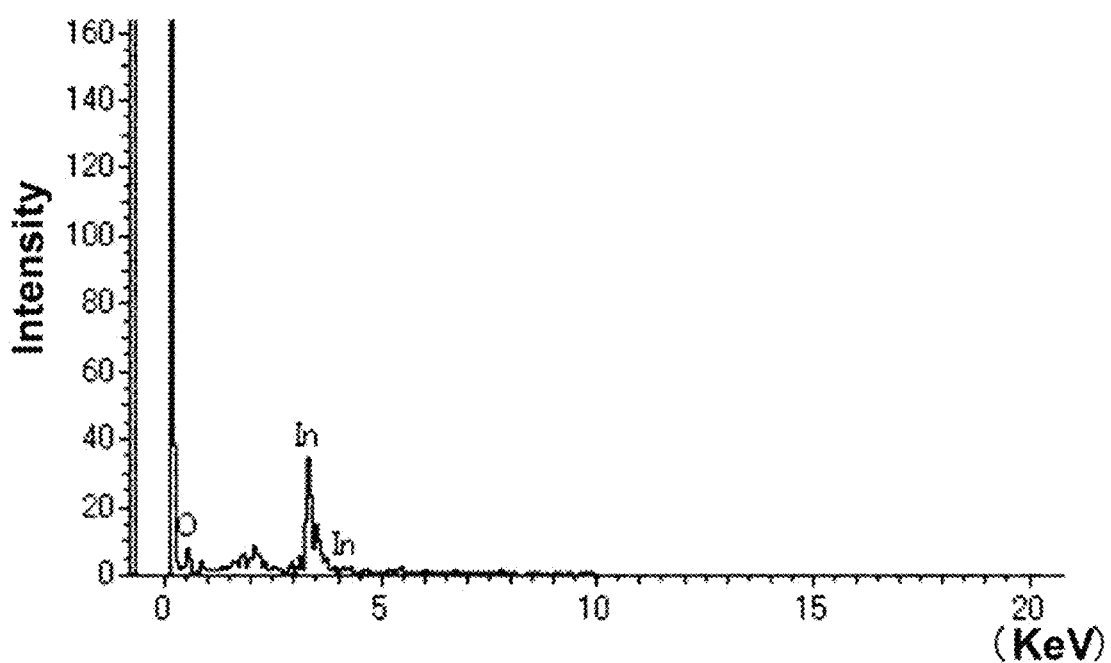
FIG. 3B is an elemental analysis spectrum of the crystal.

FIG. 3A is an electron microscope image obtained by magnifying the metal layer 3 in FIG. 2A. The present inventors have found that crystals 11 having a characteristic polyhedral shape as shown by arrows in FIG. 3A are contained in the metal layer 3. "In" and "O" were detected from the crystals 11 having the polyhedral shape in the same manner as the above analysis results. FIG. 3B snows an elemental analysis spectrum concerning the crystals 11 having the polyhedral shape. The detection method is the same as FIG. 2B. FIG. 3A and FIG. 3B suggest that only "In" was discharged from "In", "Co" and "Sb" mixed for fabricating the thermoelectric conversion member 2 to the outside of the thermoelectric conversion member 2, and the metal layer 3 containing "In" as a main component was formed (grown into crystals). The crystals 11 having the polyhedral shape do not have roundness and unevenness, and respective surfaces forming a polyhedron have rectangular shapes. Concerning dimensions thereof, one edge fails within a range of 500 nm or more and 5 μm or less. Normally, metals which have just been melted will be polycrystals. However, as thermal treatment is performed in a later-described manufacturing method according to the disclosure, atoms are rearranged with regularity so that the metal layer 3 has stable atomic arrangement, and crystals are grown in a fixed direction.

(Method of Manufacturing Thermoelectric Element)

Hereinafter, a method of manufacturing the thermoelectric conversion element 1 according to the illustrative embodiment will be explained with reference to FIGS. 4A to 4D. The thermoelectric conversion element 1 can be manufactured by performing (see FIG. 4A) a melting of a thermoelectric conversion material 2a compounded to have a desired composition in a crucible 6, (see FIG. 4B) inserting the insulator (hereinafter also referred to as the "insulating tube") 4 into the crucible 6 and sucking up the melted thermoelectric conversion material 2a, (not shown) performing a thermal treatment to the thermoelectric conversion material 2a filled in the insulating tube 4, (see FIG. 4C) cutting the insulating tube 4 after the thermal treatment to a desired length and forming the electrode 5 (see FIG. 4D) on an end surface of the thermoelectric conversion member 2 filled in the insulating tube 4 after the cutting. The manufacturing method will be explained below by citing a case where a material obtained by adding "In" to $Co_4Sb_{12}$ is used as the thermoelectric conversion material 2a as an example. Note that manufacturing can be performed by the same method by using the skutterudite material as the thermoelectric conversion material 2a even when elements and a compounding ratio thereof are arbitrarily adjusted.

Figure 4A:
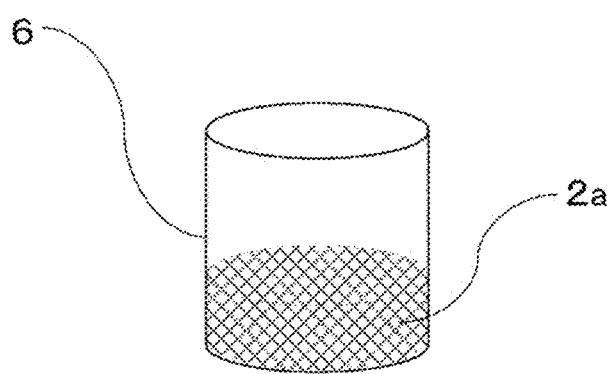
FIG. 4A is a schematic view showing the melting of a thermoelectric conversion material in a manufacturing method according to the embodiment of the present disclosure.

First, the thermoelectric conversion material 2a which has been compounded in advance, for example, $In_xCo_4Sb_{12}$ ($0<x\leq1$) is prepared (See FIG. 4A). The thermoelectric conversion material 2a may be in powder form or in ingot form. It is sufficient that an addition amount of "In" satisfies $0<x\leq1$ in the above composition formula, and it is particularly preferable that the amount satisfies $0.1\leq x\leq0.5$. There is a case where thermoelectric conversion properties in the thermoelectric conversion member 2 to be obtained is not sufficiently increased when the addition amount of "In" is small. On the other hand, when the addition amount of "In" is too large, a compound other than the skutterudite material may be formed and thermoelectric conversion properties are reduced also in this case. The thermoelectric conversion material 2a is heated to 1100 to 1200° C. and melted in the crucible 6. It is preferable that the crucible 6 has a heat resistance property as well as has a small reaction to the thermoelectric conversion material 2a with low costs. A crucible made of, for example, carbon is preferably used. It is also preferable that heating is performed in a vacuum or under the presence of an inert gas such as nitrogen from a viewpoint that oxidation of the thermoelectric conversion material 2a can be suppressed.

Figure 4B:
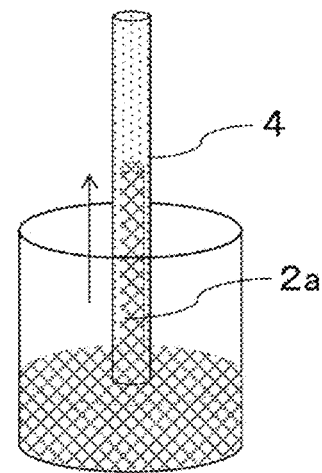
FIG. 4B is a schematic view showing the filling of an insulator with the melted thermoelectric conversion material in the manufacturing method.

After the thermoelectric conversion material 2a is sufficiently melted, inserting of the insulating tube 4 into the crucible 6, sucking up the melted thermoelectric conversion material 2a and filling the insulating tube 4 with the thermoelectric conversion material 2a is performed (FIG. 4B). The insulating tube 4 corresponds to the above insulator 4 of the thermoelectric conversion element 1. In the manufacturing method according to the embodiment, an outer diameter and a shape of the thermoelectric conversion member 2 to be obtained are determined by an inner diameter and a shape of the insulating tube 4. Here, the skutterudite-type thermoelectric conversion material 2a generally has a high melting point. For example, a melting point of $Co_4Sb_{12}$ in the vicinity of 1000° C., therefore, it is necessary to use the insulator 4 having the heat resistance property. Accordingly, it is preferable to use glass, particularly, quartz glass having a high softening temperature. As the quartz glass is an oxide and has a small reaction to the thermoelectric conversion material 2a, the quartz glass is suitable as the insulating tube 4 in the manufacturing method according to the present disclosure. The method of sucking the thermoelectric conversion material 2a into the insulating tube 4 is not particularly limited, and for example, a method of inserting one side of the insulating tube 4 into the melted thermoelectric conversion material 2a and sucking the material from the other side by using a cylinder and so on can be adopted. A sucking amount in this case can be arbitrarily selected based on an inner diameter, a length and the like of the insulating tube 4.

Next, the performing of a thermal treatment to the insulator 4 with which the thermoelectric conversion material 2a is filled (not shown) will be described. A common electric furnace can be used for thermal treatment, which is performed in a range of 500° C. to 800° C. for approximately 30 hours to 200 hours. Appropriate heating conditions differ according to the composition. For example, in the case of $In_xCo_4Sb_{12}$ ($0<x\leq1$), the thermoelectric conversion member 2 having good thermoelectric conversion properties can be obtained by performing thermal treatment at 600° C. for approximately 60 hours. Basically, the thermoelectric conversion member 2 having stable properties can be obtained when performing thermal treatment for a long time. The thermoelectric conversion material 2a does not have the skutterudite-type crystals before thermal treatment, however, the crystal structure is changed by heating. As a result, a crystal of $Co_4Sb_{12}$ in which "In" is filled can be obtained. Then, sufficient thermoelectric conversion properties can be obtained by the thermoelectric conversion element 1 containing the thermoelectric conversion member 2 formed of the composition.

The above thermal processing is preferably performed in a vacuum or under an inert gas atmosphere for suppressing oxidation of the thermoelectric conversion material 2a or the thermoelectric conversion member 2 obtained by thermal treatment. The metal layer 3 containing "In" is formed between the thermoelectric conversion member 2 and the insulating tube 4 by the thermal treatment. The metal layer 3 is generated in a process in which atomic arrangement of the thermoelectric conversion material 2a is interchanged for forming the skutterudite structure. "In" which is not incorporated in skutterudite-type crystals in "In" contained in the thermoelectric conversion material 2a is discharged to the outside of the crystals. Then, the metal layer 3 is formed between the thermoelectric conversion member 2 and the insulating tube 4.

The thermoelectric conversion element 1 having the metal layer 3 can be obtained by the filling of the insulating tube 4 with the thermoelectric conversion material 2a and by performing thermal treatment at a temperature different from a temperature at the time of the filling. For example, when the composition of the thermoelectric conversion material 2a is $In_xCo_4Sb_{12}$ ($0<x\leq1$), the temperature at the time of the filling is 1000° C. to 1200° C. and the temperature at the time of thermal treatment performed after filling the insulating tube 4 is 500° C. to 800° C. It is necessary that the thermoelectric conversion material 2a (skutterudite material) is melted at the time of filling the insulating tube 4, therefore, the temperature should exceed a melting point. The thermal treatment is performed at a temperature sufficiently lower than the melting point for promoting movement of atoms in a solid state, namely, in a crystal state.

The metal layer 3 contains the crystals 11 having the polyhedral shape shown in FIG. 3A as explained in the above-described thermoelectric conversion element. The polyhedral-shaped crystals 11 are generated by receiving the thermal treatment as described below. First, "In" which has not been incorporated with the skutterudite-type crystals form a layered metal layer 3 as described above. After the "In" is further discharged, "In" is grown regularly with certain points as nuclei, and the polyhedral-shaped crystals 11 as shown in FIG. 3A are generated. That is to say, the atoms are moved so as to be in the most stable state as the energy state by the heating to thereby form characteristic polyhedral-shaped crystals 11. The polyhedral-shaped crystals 11 can be formed by thermal treatment in a range of 600° C. or more to 800° C. or less for approximately 30 hours to 200 hours. In more detail, presence of formation of the polyhedral-shaped crystals 11 is determined according to conditions of thermal treatment. That is, as the polyhedral-shaped crystals 11 are formed after "In" is discharged, thermal energy to be added to the metal layer 3 is reduced when thermal treatment is performed at a low temperature or a thermal treatment time is short, therefore, the polyhedral-shaped crystals 11 are not formed. For example, in the case of $In_xCo_4Sb_{12}$ ($0<x\leq1$), the polyhedral-shaped crystals 11 are not formed when the thermal treatment temperature is lower than 600° C. and the thermal treatment time is shorter than 30 hours. However, the formation of the polyhedral-shaped crystals 11 indicates that sufficient thermal treatment is performed to the thermoelectric conversion material 2a. Therefore, it is more preferable that the metal layer 3 contains the polyhedral-shaped crystals 11 in the thermoelectric conversion element 1 manufactured in the embodiment for fulfilling properties as the thermoelectric conversion element 1.

Figure 4C:
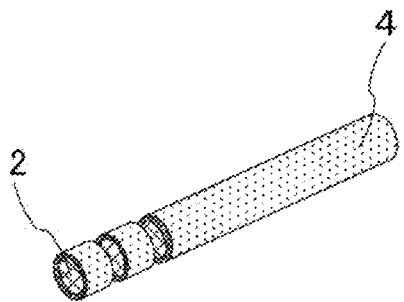
FIG. 4C is a schematic view showing the cutting of the insulator and a thermoelectric conversion member in the manufacturing method and FIG. 4D is a schematic view showing the forming of art electrode on the thermoelectric conversion member in the manufacturing method.
Figure 4D:
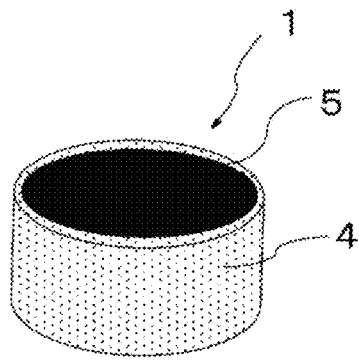

After the above thermal treatment, the insulating tube 4 filled with the thermoelectric conversion member 2 is cut to a desired length (FIG. 4C). As a method of cutting the insulating tube 4 and the thermoelectric conversion member 2, cutting by a blade or cutting by wire can be adopted, and the wire cutting capable of performing bulk processing is desirable from a viewpoint of productivity. In the case where the insulating tube 4 is formed of quartz, the thermoelectric conversion member 2 made of metal and hard quarts (glass) are simultaneously cut. Accordingly, as conditions for wire cutting, an abrasive grain is reduced and a linear velocity of the wire is reduced, thereby reducing cracking of quartz (glass) or chipping of the thermoelectric conversion member 2.

Next, the electrode 5 is formed on a cut surface of the thermoelectric conversion member 2 after the cutting. As described above, the electrode 5 fulfills two functions which are suppression of metal diffusion and joining to the wiring substrate. Accordingly, explanation will be made by citing a case where the electrode 5 has a two-layer structure as an example. In the embodiment, Ti is used as a film for suppressing metal diffusion, and Ag is used as a film for joining to the wiring substrate. As a method of forming respective films which make the electrode 5, a sputtering method can be cited. Though a plating method and so on can be also considered as the method of forming respective films, the elements like Ti are not capable of being plated and further, the plating is a wet method, therefore, there is a possibility that these materials enter a gap between the insulator 4 and the thermoelectric conversion member 2 at the time of forming the electrode 5 to form a film at unnecessary places. A film forming method by spraying may be considered, however, it is not preferable in a point that control of a film thickness is difficult and in a point of suppressing metal diffusion as a film quality tends to be relatively sparse. On the other hand, these problems can be avoided in the film formation by spattering. As thicknesses of films, a film made of Ti is formed to have 1 μm and a film made of Ag is formed to have approximately 400 nm, thereby giving the electrode 5 to have functions which are suppression of metal diffusion and joining.

The thermoelectric conversion element 1 according to the illustrative embodiment of the present disclosure can be obtained by performing the above manufacturing method. A point that the thermoelectric conversion element 1 including the metal layer 3 is not capable of being obtained by the normal manufacturing method and can be obtained only by the manufacturing method according to the embodiment will be explained. In the normal thermoelectric conversion element, thermal treatment is performed as an ingot or a sintered body first, thereby forming the skutterudite-type thermoelectric conversion member. After that, the member is cut in three directions so that a width, a length and a height have desired values to be used for the thermoelectric conversion element. That is, even when the side surface of the thermoelectric conversion member is mechanically processed and if the metal layer is generated on the surface of the thermoelectric conversion member by thermal treatment, the region is removed by cutting in the final thermoelectric conversion element, therefore, the thermoelectric conversion element does not have the metal layer. On the other hand, in the manufacturing method according to the embodiment, the thermoelectric conversion material 2a is filled in the insulating tube 4, then, the thermal treatment is performed to form the thermoelectric conversion material 2a into the thermoelectric conversion member 2. Then, the insulating tube 4 is cut to a desired length, namely, cut the insulating tube 4 perpendicularly to a length direction. Further in the manufacturing method according to the embodiment, processing is performed only to an end surface exposed by the cutting (to form the electrode 5). Accordingly, the metal layer 3 formed by the thermal treatment is contained in the thermoelectric conversion element 1 as it is.

(Thermoelectric Conversion Module)

Figure 5:
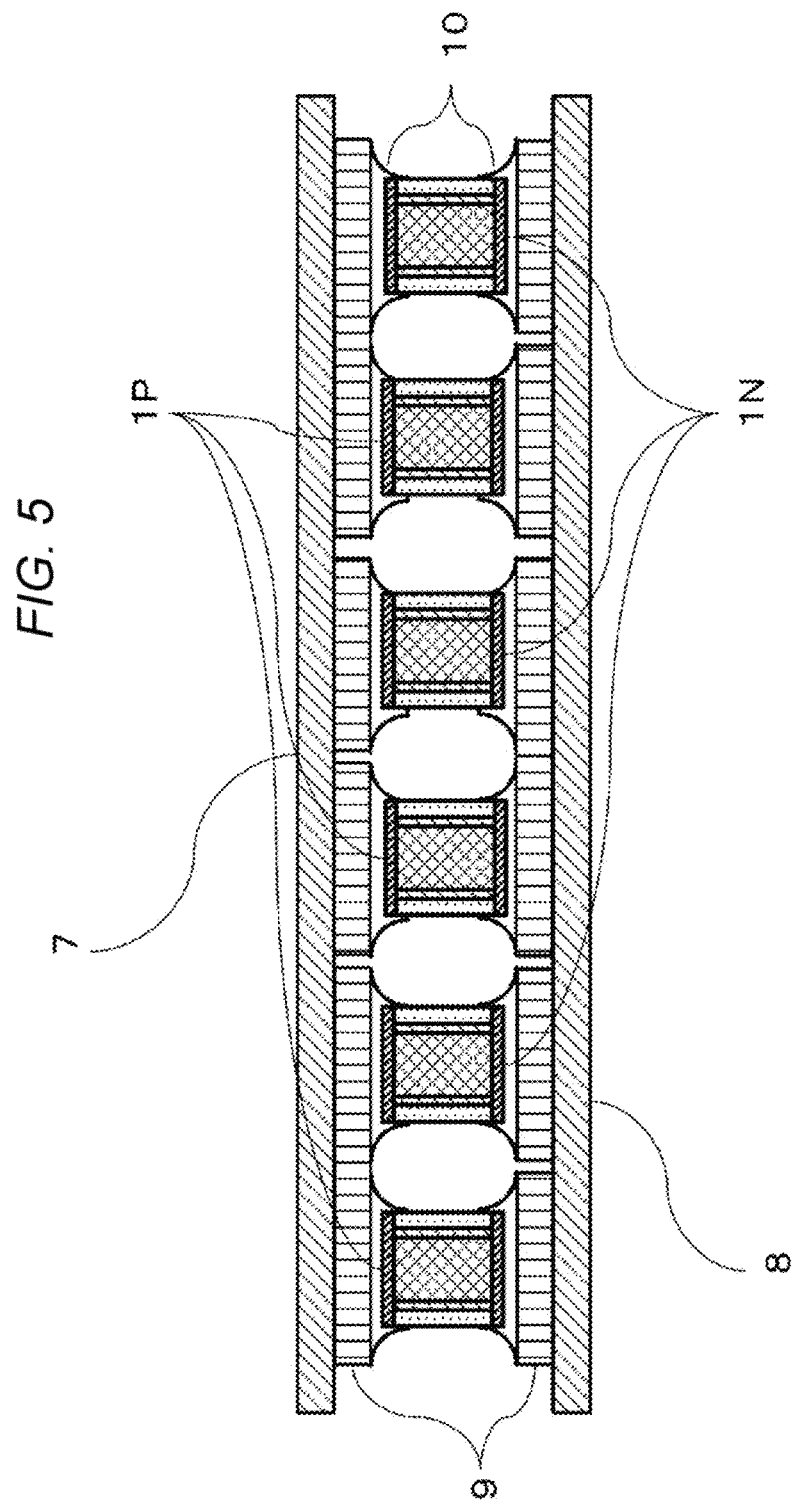
FIG. 5 is a schematic cross-sectional view showing a thermoelectric conversion module according to the embodiment of the present disclosure.
Figure 6:
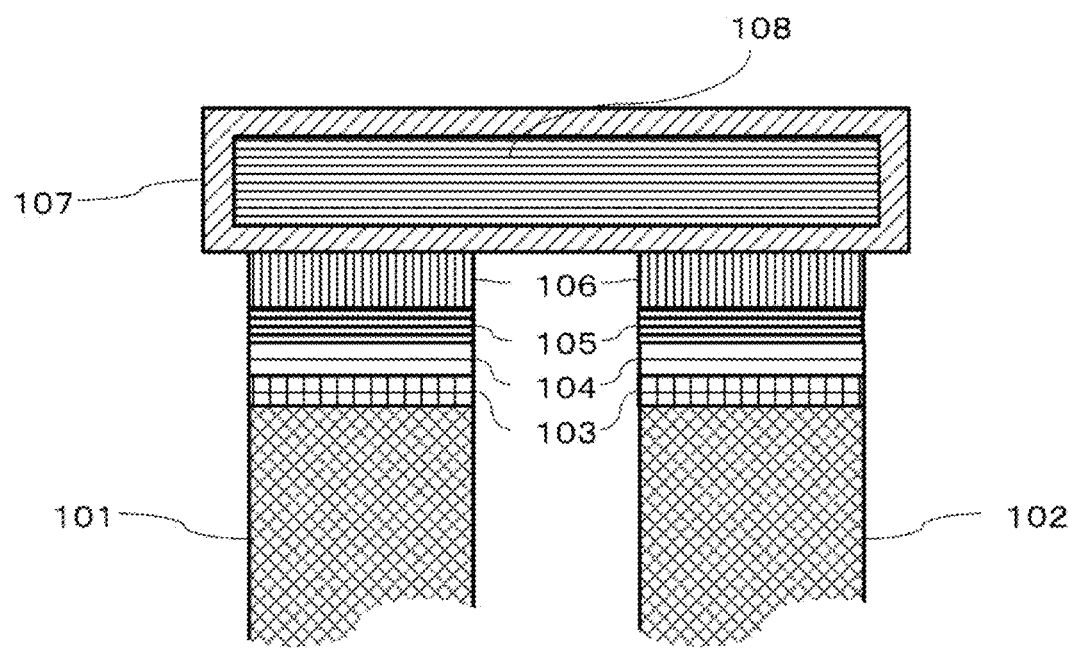
FIG. 6 is a schematic cross-sectional view showing a related-art thermoelectric conversion element.

FIG. 5 is a cross-sectional schematic view showing an example of a thermoelectric conversion module using the thermoelectric conversion elements 1. The thermoelectric conversion elements 1 are arranged so that P-type thermoelectric conversion elements 1P and N-type thermoelectric conversion elements 1N are connected in series. These elements are sandwiched between a high-temperature side substrate 7 and a low-temperature side substrate 8. Wiring electrodes 9 are respectively formed in the high-temperature side substrate 7 and the low-temperature side substrate 6, and the thermoelectric conversion elements 1 and the wiring electrodes 9 are electrically joined by a joint portion 10. Both the P-type thermoelectric conversion elements 1P and N-type thermoelectric conversion elements 1N can be formed by elements having the thermoelectric conversion members formed of the skutterudite-type material. For example, the material for an N-type thermoelectric conversion member is represented by a composition formula $Co_4Sb_{12}$, and a material for a P-type thermoelectric conversion member is represented by a composition formula $Fe_xCo_{4-x}Sb_{12}$ obtained by replacing part of "Co" in the N-type material with "Fe". Both materials contain filling elements such as "In". The metal layer 3 can be formed between the thermoelectric conversion member and the insulator in both compositions by manufacturing the elements by the above-described manufacturing method.

The thermoelectric conversion module according to the present disclosure may be configured by combining, for example, a first-conductive type first thermoelectric conversion element with a second-conductive type second thermoelectric conversion element having different conductive type from the first thermoelectric conversion element. Respective thermoelectric conversion elements may be fabricated by the above-described manufacturing method.

As the high-temperature side substrate 7 of the thermoelectric conversion module, a substrate formed of ceramics such as alumina or silicon nitride is preferably used. This is because a resin substrate is inferior in heat resistance property when the substrate is assumed to be used at high temperature. On the other hand, the low-temperature side substrate 8 is not particularly limited as long as the substrate has a sufficient heat resistance property at a use temperature, and ceramic and resin substrates can be used. It is preferable that the wiring electrodes 9 formed in respective substrates are formed of a metal such as Ag which is not easily oxidized in consideration of the heat resistance property. It is also preferable that the joint portion 10 is not easily oxidized, and when Ag is adopted as the wiring electrodes 9, the joint portion 10 preferably uses Ag brazing or sintered Ag in consideration of a joining property.

(Illustrative Effects)

Hereinafter, illustrative effects of the thermoelectric conversion element and so on according to the present disclosure will be explained. In the thermoelectric conversion element 1 according to the present disclosure, the thermoelectric conversion member 2 and the insulator 4 are not completely adhered, and a gap into which oxygen can enter exists. Accordingly, even when the electrodes 5 are formed on the upper bottom surface and the lower bottom surface of the thermoelectric conversion member 2 by sputtering and so on, it is difficult to block the gap. When joining to the substrates by the joint portion 10, for example, when a fillet (joining portion 10) is formed by using an Ag nano-paste as shown in FIG. 5, adhesion between the joining portion 10 and the insulator 4 is not high. Accordingly, the insulator 4 is joined only to the electrodes 5 under high temperature. In the thermoelectric conversion module having the above structure, the thermoelectric conversion elements 1 according to the present disclosure are extremely effective. That is, when the thermoelectric conversion element 1 has the metal layer 3, oxygen entering even from a slight gap contacts the metal layer 3 before contacting the thermoelectric conversion member 2. Then, oxygen immediately oxidizes the metal layer 3, not the thermoelectric conversion member 2. That is, in the thermoelectric conversion element 1 according to the present disclosure, the metal layer 3 is oxidized as a sacrifice, and oxidation of the thermoelectric conversion member 2 is suppressed. That is, the metal layer 3 formed in a process of manufacturing the thermoelectric conversion element 1 functions as a sacrifice layer for protecting the thermoelectric conversion member 2. Furthermore, the metal layer 3 has plural polyhedral-shaped crystals 11, therefore, the surface area is increased and the metal layer 3 fulfills excellent performance as the sacrifice layer. Additionally, length of respective edges of the polyhedral-shaped crystals 11 are set to be 500 nm or more and 5 μm or less, thereby obtaining further higher effects.

For example, in the case where the thermoelectric conversion member is $Co_4Sb_{12}$, when the thermoelectric conversion member is exposed to 400° C. under the presence of oxygen. Antimony oxide is immediately formed and oxidation proceeds as Sb is easily oxidized. The Antimony oxide is a black and brittle substance, the elements is broken. On the other hand, the thermoelectric conversion member 2 other than regions where the electrodes 5 are formed is covered with the insulator 4 in the thermoelectric conversion element 1 according to the disclosure. Accordingly, oxidation of the thermoelectric conversion member 2 can be sufficiently suppressed. And further, oxygen entering from a slight gap is trapped by the metal layer 3. Therefore, extremely high reliability can be obtained as compared with related-art thermoelectric conversion elements.

The above metal layer 3 is formed (deposited) so that the thickness thereof fails in a range of 10 nm or more and 500 nm or less, and the film is not always necessary to be successive. In the case where the thermoelectric conversion element 1 is fabricated by the manufacturing method, the insulator 4 or the electrode 5 exists around the thermoelectric conversion member 2 even when part of the metal layer 3 is broken. Then, oxygen enters from the gap between the insulator 4 and the thermoelectric conversion member 2 in the upper bottom surface or the lower bottom surface of the thermoelectric conversion element 1. Therefore, even when the metal layer 3 is not the successive film, the metal layer 3 can sufficiently trap oxygen, and certain effects can be obtained.

The thermoelectric conversion material according to the present disclosure is excellent in reliability of thermoelectric conversion properties under high temperature as compared with related-art thermoelectric conversion elements, which can be applied to high temperature energy recovery such as waste heat in cars and factories.

Although the present disclosure has been described with reference to the aforementioned embodiments, this description is not meant to be construed in a limiting sense. Various modifications of the disclosed embodiments as well as alternative embodiments of the invention will become apparent to persons skilled in the art. It is therefore contemplated that the appended claims will cover any such modifications or embodiments.

What is claimed is:

1. A thermoelectric conversion element comprising:
   a thermoelectric conversion member formed of a skutterudite-type material containing an element L indicating one or more elements selected from the group consisting of In, Yb, Eu, Ce, La, Nd, Ga and Sr, an element M indicating one or more elements selected from the group consisting of Co, Rh, Ir, Fe, Ni, Pt, Pd, Ru and Os, and an element Pn indicating one or more elements selected from the group consisting of Sb, As, P, Te, Sn, Bi, Ge, Se and Si;
   an insulator covering at least part of the thermoelectric conversion member; and
   a metal layer positioned between the thermoelectric conversion member and the insulator, the metal layer containing at least the element L,
   wherein the metal layer has a plurality of polyhedral-shaped crystals containing the element L, and
   wherein the plurality of polyhedral-shaped crystals containing the element L do not have roundness and unevenness, and respective surfaces forming the polyhedral-shaped crystals have rectangular shapes.

2. The thermoelectric conversion element according to claim 1,
   wherein lengths of respective edges of the polyhedral-shaped crystals are at least 500 nm and no greater than 5 μm.

3. The thermoelectric conversion element according to claim 1,
   wherein a thickness of the metal layer is at least 10 nm and no greater than 500 nm.

4. The thermoelectric conversion element according to claim 1,
   wherein the metal layer further contains an oxide of the element L.

5. The thermoelectric conversion element according to claim 1,
   wherein the thermoelectric conversion member has a columnar shape and the insulator covers a side surface of the columnar shape.

6. The thermoelectric conversion element according to claim 1,
   wherein the element L is "In", the element M is "Co" and the element Pn is "Sb".

7. The thermoelectric conversion element according to claim 1,
   wherein the insulator is quartz.

8. The thermoelectric conversion element according to claim 1,
   wherein the polyhedral-shaped crystals are disposed on a surface of the metal layer at an interface with the thermoelectric conversion member.

* * * * *